(12) United States Patent
Torige

(10) Patent No.: US 8,456,884 B2
(45) Date of Patent: Jun. 4, 2013

(54) SEMICONDUCTOR DEVICE

(75) Inventor: Yuji Torige, Kanagawa (JP)

(73) Assignee: Sony Corporation, Tokyo (JP)

( * ) Notice: Subject to any disclaimer, the term of this patent is extended or adjusted under 35 U.S.C. 154(b) by 68 days.

(21) Appl. No.: 13/138,907

(22) PCT Filed: Jun. 8, 2010

(86) PCT No.: PCT/JP2010/059704
§ 371 (c)(1),
(2), (4) Date: Oct. 21, 2011

(87) PCT Pub. No.: WO2010/147029
PCT Pub. Date: Dec. 23, 2010

(65) Prior Publication Data
US 2012/0039105 A1    Feb. 16, 2012

(30) Foreign Application Priority Data
Jun. 15, 2009 (JP) .................. 2009-142682

(51) Int. Cl.
*G11C 17/00* (2006.01)
(52) U.S. Cl.
USPC .......... 365/96; 365/100; 365/148; 365/225.7

(58) Field of Classification Search
USPC ........................ 365/96, 100, 148, 163, 225.7
See application file for complete search history.

(56) References Cited

U.S. PATENT DOCUMENTS

| | | | |
|---|---|---|---|
| 7,269,081 B2 | 9/2007 | Ito | |
| 2004/0174732 A1* | 9/2004 | Morimoto | 365/148 |
| 2008/0002451 A1* | 1/2008 | Anand et al. | 365/96 |
| 2011/0103132 A1* | 5/2011 | Wei et al. | 365/148 |

* cited by examiner

Primary Examiner — Alexander Sofocleous
Assistant Examiner — Hien Nguyen
(74) Attorney, Agent, or Firm — Rader, Fishman & Grauer PLLC

(57) ABSTRACT

Both decreasing access time and power consumption and improving storage bit count per one word line are compatibly attained. A memory cell array 1 has a configuration in which at least one row of memory cells MC having a fuse device F with a resistance value variable according to a flowing current and a plurality of cell transistors (TRB1 and TRB2) connected in parallel with respect to the fuse device F is arranged. In the relevant semiconductor device, out of the plurality of cell transistors (TRB1 and TRB2), the number of cell transistors turned ON is controllable by a writing control signal (WRITE) inputted from outside and an internal logic circuit 5 (and a word line drive circuit 4).

7 Claims, 6 Drawing Sheets

IN THE CASE OF TR B1 : 5 μm, TR B2 : 20 μm, TR B3 : 10 μum

| WTEST0 | WTEST1 | Total W LENGTH |
|--------|--------|----------------|
| 0 | 0 | 35 μm |
| 1 | 0 | 15 μm |
| 0 | 1 | 25 μm |
| 1 | 1 | 5 μm |

SEMICONDUCTOR DEVICE

TECHNICAL FIELD

The present invention relates to a semiconductor device that has a memory cell having a storage device with a resistance value variable according to a flowing current and a cell transistor for accessing the same in a memory cell array.

BACKGROUND ART

As a representative storage device with a resistance value variable according to a flowing current, a resistance random access memory device and a fuse device are known. The resistance random access memory device is a memory device using conductivity change according to input/output of conductive ions to/from an insulating film and magnetization direction of a magnetic film, phase change of a crystal structure and the like, and is able to reversibly change a resistance value.

Meanwhile, as the fuse device, in addition to a fuse device which is burned out by laser light, for example, a fuse device that controls the resistance value by electrically melting down a fuse made of polysilicon is known (for example, see Non-patent document 1). As another example of the fuse device, a fuse device for performing data storage based on whether or not a gate oxide film of an MOS transistor is electrically broken down is known (for example, see Patent document 1). The foregoing electrically controllable fuse devices are particularly called electric fuses (eFUSE).

In the eFUSE, the occupied area and the current amount flown at the time of resistance change are larger than those of the foregoing resistance random access memory that electrically changes a resistance value. However, in the eFUSE, the configuration is simple, and almost no additional step is necessitated in the manufacturing process. Thus, it is often the case that the eFUSE is used not as a so-called general memory but as a storage for additional information. For example, the eFUSE is used for characteristics adjustment (trimming) of a semiconductor device (integrated circuit), redundant circuit selection, rewritable storage of characteristics values and other information after completing the device, and the like.

In general, a memory cell using the eFUSE is formed by serially connecting one eFUSE and one access transistor. In general, one end of a serially connected path (cell current path) between the eFUSE and the access transistor is connected to a power supply path through a bit line, and the other end of the foregoing cell current path is grounded. In the eFUSE, for example, by melting down a conductive layer and breaking down an insulating film, a resistance value is able to be incomparably changed, and thereby 1 bit data is storable. In this case, in writing operation for performing data storage by melting down the conductive layer and breaking down the insulating film, a writing power voltage (hereinafter referred to as a programming voltage) is applied to the foregoing power supply path. Thereby, though the resistance value of the eFUSE is changed from low resistance to high resistance, opposite operation is not possible.

In reading operation of storage data (information on whether a resistance value remains as the initial low resistance or has been transferred to high resistance), a reading power voltage (hereinafter referred to as a reading voltage) is applied to the foregoing power supply path. Then, the access transistor is turned ON, and size of a flowing current is converted to, for example, a voltage value, and sensing is performed.

PRIOR ART DOCUMENTS

Patent Document

Patent document 1: U.S. Pat. No. 7,269,081 description

Non-Patent Document

Non-patent document 1: "a compact eFUSE programmable array memory for SOI CMOS," IEEE. 2007 Symposium on VLSI Circuit of Technical Papers, Pp. 72-73, J. Safran, et. al.

SUMMARY OF THE INVENTION

In a semiconductor device having a storage device with a resistance value variable according to a flowing current in a memory cell, in the case where a current value at the time of writing data is large, size of an access transistor should be increased by just that much. Necessary size of the access transistor depends on size of a programming voltage. However, in the case where programming is performed at a lower voltage, the size of the access transistor should be more increased. For example, by taking an eFUSE as an example, in some cases, necessary size of the access transistor is 100 times or more as much as that of SRAM access transistors of the same generation.

A gate of the access transistor is connected to an access line (in general, this is called a word line) common to a plurality of memory cells arranged in lines in the row direction, for example. Thus, in the case where a size of each access transistor is large, capacity of the word line (comprehensive capacity of wiring capacity and load capacity) becomes extremely large.

It is unavoidable that the word line capacity becomes extremely large, since it is necessary to flow a large current in writing operation. However, this has a negative impact on reading operation. Specifically, at the time of reading operation, it is not necessary to increase electric potential of the word line compared to at the time of writing operation. Thus, in some cases, the reading voltage applied to the word line at the time of reading is lower than the programming voltage applied to the word line at the time of writing. In reality, since it is necessary to read the storage data while retaining the resistance value changed by writing operation, the reading voltage is lower than the programming voltage. However, in the case where the word line with a large capacity is driven at a low voltage, access time is increased. Further, since the word line capacity is extremely large, excessive power is consumed at the time of charging and discharging the word line, which is an inhibitory element of incapability of reducing power consumption of semiconductor devices.

In the case where the access time at the time of reading is long and desired operation time is not satisfied as described above, the number of memory cells (storage bit count) connectable per one word line is limited. In some cases, such limitation of the number of memory cells occurs similarly in the case where the memory power consumption is excessively large due to needs of a system on which the relevant memory is installed. Accordingly, trade-off relation exists between decreasing the access time and the power consumption and improving the storage bit count per one word line.

Such trade-off exists more strictly in the eFUSE memory necessitating a large current at the time of writing. However, such trade-off should be similarly resolved in other memories with a resistance value variable according to a flowing current (for example, a resistance random access memory) to some degree or another.

To resolve the foregoing problem, it is an object of the present invention to provide a semiconductor device capable of resolving or odifying the foregoing trade-off.

A semiconductor device according to the present invention includes a memory cell array in which a plurality of memory cells are arranged at least in one row. The memory cell has a storage device with a resistance value variable according to a flowing current and a plurality of cell transistors that are serially connected to the storage device and are connected in parallel with each other.

According to the foregoing configuration, the plurality of cell transistors that are connected in parallel with each other are included for every memory cell. Thus, the current flown to the storage device is able to be optimally controlled at the time of operation. For example, in the case where a current value necessary for the case of date storage is larger than a current value necessary at the time of reading data, the number of cell transistors turned ON at the time of data storage is able to be larger than that at the time of reading data. Therefore, the total operation time is decreased down to the very minimum. Further, in operation to turn ON only the necessary number of cell transistors out of the plurality of cell transistors, power consumption is decreased more than that of operation to turn ON all the cell transistors. Meanwhile, since operation time and power consumption are decreased, the number of memory cells concurrently driven is able to be increased.

According to the present invention, a semiconductor memory device in which trade-off between decreasing the access time and the power consumption and improving the storage bit count per one word line is resolved or modified is able to be provided.

DESCRIPTION OF EMBODIMENT

Embodiments of the present invention will be hereinafter described with reference to the drawings in the after-mentioned order. It is to be noted that the description will be given in the following order.
1. First embodiment: example that an access transistor is composed of two cell transistors arranged in parallel with each other (including comparative explanation by contrast with a comparative example)
2. Second embodiment: example that an access transistor is composed of three or more cell transistors arranged in parallel with each other, and effective gate width of the access transistors is variable by inputted control signals
3. Other modifications: Modifications other than modifications described as appropriate in the descriptions of the foregoing first embodiment and the foregoing second embodiment 1. First Embodiment

Figure 1:
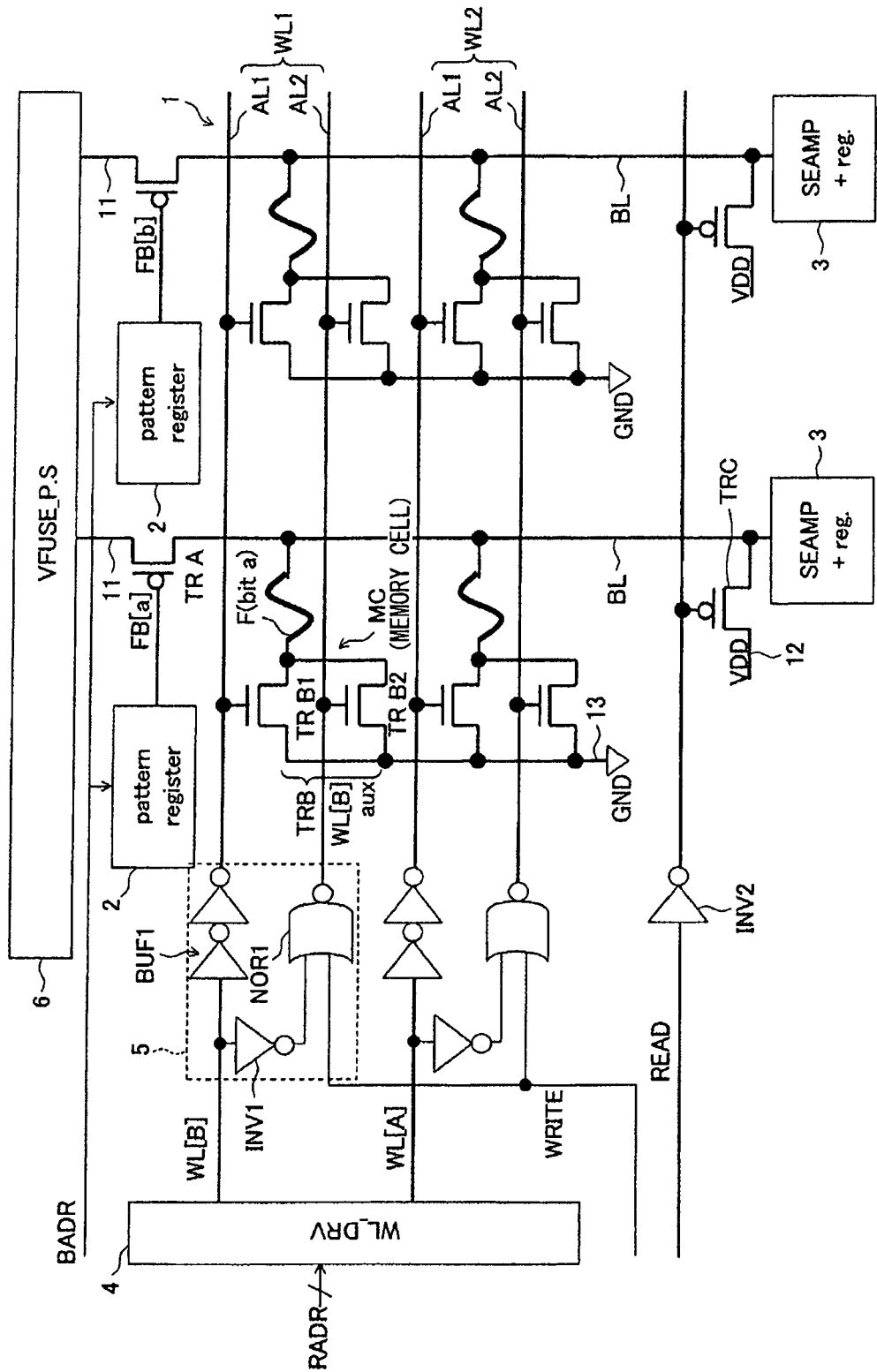
FIG. 1 is a chip configuration diagram of a semiconductor device according to a first embodiment.

[Chip Configuration]
FIG. 1 illustrates a chip configuration diagram of a semiconductor device according to the first embodiment. The semiconductor device of this embodiment includes a memory cell array 1 and various control circuits for controlling programming (writing) and reading of the memory cell array 1.

In the memory cell array 1, a plurality of memory cells MC are arranged in a matrix state. As described later, each of the memory cell MC is provided between a bit line BL and a third voltage supply line (GND line 13), and, for example, has a fuse device F and an access transistor TRB serially connected to the fuse device F. FIG. 1 exemplifies a case that four memory cells MC are arranged in two columns (2 bits)×2 rows. However, arrangement of the plurality of memory cells MC is not limited to the arrangement of FIG. 1, and for example, the plurality of memory cells MC may be arranged in one row. It is to be noted that, in the following description, arrangement of the plurality of memory cells MC is a plurality of columns×a plurality of rows unless there is special mentioning.

Configuration that the plurality of memory cells MC are arranged in the column direction is hereinafter referred to as bit configuration. FIG. 1 exemplifies a case that each bit configuration in each column has the same configuration. However, each bit configuration in each column does not necessarily have the same configuration. It is to be noted that, in the following description, only one bit configuration will be explained on the premise that bit configuration of each column has the same configuration with respect to one another.

In this embodiment, the access transistor TRB is composed of two cell transistors, that is, a first cell transistor TRB1 and a second cell transistor TRB2. The first and the second cell transistors TRB1 and TRB2 are each composed of an NMOS transistor, and are connected to each other in parallel. The first cell transistor TRB1 is a cell transistor that is constantly used (is turned ON) at the time of reading and at the time of programming. Further, out of the two cell transistors included in the access transistor TRB, one cell transistor (second cell transistor TRB2) other than a cell transistor X is a cell transistor used only at the time of reading. The first and the second cell transistors TRB1 and TRB2 each have size smaller than that of an access transistor TRB composed of a single access transistor, for example. Further, the total size of the first and the second cell transistors TRB1 and TRB2 is equivalent to the size of the access transistor TRB composed of a single access transistor, for example.

The semiconductor device of this embodiment has a plurality of word lines WL1, WL2, and so on extending in the row direction. Each of the word lines WL1, WL2, and so on is in a form that at least one of the plurality of cell transistors (two in this embodiment) in each memory cell MC is able to be turned ON/OFF independently of the other cell transistor(s) and includes a plurality of access lines connected to a gate of each cell transistor. Specifically, the respective word lines WL1, WL2, and so on are composed of a first access line AL1 to which word line drive signals WL[A], WL[B], and so on (described later) are inputted and a second access line AL2 to which auxiliary word line drive signals WL[A]aux, WL[B]aux, and so on (described later) that are generated in response to the word line drive signals WL[A], WL[B], and so on are inputted. In each cell row, a gate of the first cell transistor TRB1 included in each memory cell MC is connected to the first access line AL1. Similarly, in each cell row, a gate of the second cell transistor TRB2 included in each memory cell MC is connected to the second access line AL2.

The word line drive signals WL[A], WL[B], and so on control electric connection/disconnection of a current path from the bit line BL to the third voltage supply line (GND line 13) including the fuse device F. For example, in the case where the fuse device F is connected to the bit line BL, the word line drive signals WL[A], WL[B], and so on control electric connection/disconnection between the fuse device F and the third voltage supply line (GND line 13). Further, for example, in the case where the fuse device F is connected to the third voltage supply line (GND line 13), the word line drive signals WL[A], WL[B], and so on control electric connection/disconnection between the bit line BL and the fuse device F.

The semiconductor device of this embodiment includes a word line drive circuit (WL_DRV) 4 generating the word line drive signals WL[A], WL[B], and so on and a logic circuit 5 generating the auxiliary word line drive signals WL[A]aux, WL[B]aux, and so on from the word line drive signals WL[A], WL[B], and so on. In the example of FIG. 1, the word line drive circuit 4 is provided as a circuit common to each cell row. Each of the word lines WL1, WL2, and so on is connected to output of the word line drive circuit 4. For example, the word line drive circuit 4 inputs the word line drive signal WL[A] to the first access line AL1 included in the word line WL1, and inputs the word line drive signal WL[B] to the first access line AL1 included in the word line WL2.

In the example of FIG. 1, one logic circuit 5 is provided for every column, and the logic circuit 5 includes a buffer circuit BUF1, an inverter INV1, and a NOR circuit NOR1. It is to be noted that, in the case where the plurality of memory cells MC are arranged in one row, the logic circuit 5 is provided for every memory cell.

The buffer circuit BUF1 is inserted into the first access line AL1. The buffer circuit BUF1 outputs the word line drive signals WL[A], WL[B], and so on inputted from the word line drive circuit 4 to the respective first cell transistors TRB1 connected to the first access lines AL1.

The NOR circuit NOR1 has 2 inputs and 1 output configuration. The output of the NOR circuit NOR1 is connected to the second access line AL2. One input of the NOR circuit NOR1 is connected to the first access line AL1 through the inverter INV1, and the other input of the NOR circuit NOR1 is connected to a writing control line. The foregoing writing control line is a line to which a writing control signal (WRITE) is inputted. In this embodiment, the writing control signal (WRITE) controls output of the auxiliary word line drive signals WL[A]aux, WL[B]aux, and so on (in the example of FIG. 1, signals obtained by inverting signal waveforms of the word line drive signals WL[A], WL[B], and so on) that are generated in response to the word line drive signals WL[A], WL[B], and so on to the second access line AL2.

The NOR circuit NOR1 performs NOT operation of a logical sum of the signal inputted from the first access line AL1 through the inverter INV1 (the signals obtained by inverting the signal waveforms of the word line drive signals WL[A], WL[B], and so on) and the signal inputted from the writing control line (control signal (WRITE)). Only in the case where no input exists in both the two input terminals, the NOR circuit NOR1 outputs H (high). In the case where input exists at least in one of the two input terminals, the NOR circuit NOR1 outputs L (low).

Accordingly, the word line drive circuit 4 and the logic circuit 5 control ON/OFF of the plurality of cell transistors included in each memory cell by inputting the word line drive signals WL[A], WL[B], and so on to the first access line AL1 and inputting the auxiliary word line drive signals WL[A]aux, WL[B]aux, and so on to the second access line AL2. As described later in detail, the word line drive circuit 4 and the logic circuit 5 control ON/OFF of the plurality of cell transistors included in each memory cell so that the number of cell transistors turned ON at the time of reading operation is smaller than the number of cell transistors turned ON at the time of programming operation (at the time of writing operation).

It is to be noted that, in the case where load of the first access line AL1 is large, the buffer circuit BUF1 is desirably provided as a circuit to aid the word line drive circuit 4. However, in the case where drive power of the word line drive circuit 4 is sufficient, the buffer circuit BUF1 is able to be omitted.

Further, FIG. 1 exemplifies a case that the word line drive circuit 4 is provided in the relevant semiconductor device. However, the word line drive circuit 4 may be provided independently of the relevant semiconductor device. In this case, the word line drive signals WL[A], WL[B], and so on are inputted from the word line drive circuit 4 provided independently of the relevant semiconductor device (that is, from outside) to the first access line AL1 in the relevant semiconductor device. Further, in this case, the buffer circuit BUF1 for driving the first access line AL1 should be provided. Further, the inverter INV1 and the NOR circuit NOR1 need drive ability, for driving the second access line AL2.

FIG. 1 exemplifies a case that the writing control signal (WRITE) is given from outside of the device. However, the writing control signal (WRITE) may be given from a circuit provided inside the device.

Next, a description will be given of a configuration for controlling a bit line voltage. The semiconductor device of this embodiment has the plurality of bit lines BL extending in the column direction. The plurality of bit lines BL are assigned one by one for every column. Further, the semiconductor device of this embodiment has a first voltage supply line 11, a second voltage supply line (VDD line 12), the third voltage supply line (GND line 13), a writing bit selection transistor TRA, a pattern register 2, and a reading circuit (SEAMP+reg.) 3 for every column. Further, the semiconductor device of this embodiment has a fuse voltage supply circuit (VFUSE_P.S) 6 common to each bit configuration.

One end (a source or a drain) of the writing bit selection transistor TRA is connected to one end of each bit line BL. The reading circuit 3 and one end (a source or a drain) of the reading bit selection transistor TRC are connected to the other end of each bit line BL. One end of each of the plurality of fuse devices F provided one by one for every memory cell MC is connected to a middle section of each bit line BL. One end (a source or a drain) of each of the first and the second cell transistors TRB1 and TRB2 connected to each other in parallel is connected to the other end of each fuse device F. The third voltage supply line (GND line 13) is connected to the other end (one of the source and the drain that is not connected to the fuse device F) of the first and the second cell transistors TRB1 and TRB2 connected to each other in parallel. An output end of the fuse voltage supply circuit 6 is connected to the other end (one of the source and the drain that is not connected to the bit line BL) of the writing bit selection transistor TRA. An output end of a pattern register 2 is connected to a gate of the writing bit selection transistor TRA. The VDD line 12 is connected to the other end (one of the source and the drain that is not connected to the bit line BL) of the reading bit selection transistor TRC. The reading control line is connected to a gate of the reading bit selection transistor TRC.

The fuse voltage supply circuit 6 is a circuit for generating, for example, several [V] writing voltage VW at the time of writing as a voltage value outputted to the first voltage supply line 11. It is to be noted that the writing voltage VW may be given from an external tester or a substrate on which the relevant semiconductor device (IC) is mounted instead of the fuse voltage supply circuit 6.

A path from the first voltage supply line 11 to the GND line 13 through the writing bit selection transistor TRA, the bit line BL, and the memory cell MC is a first current path (writhing current path) through which a first current (writing current Iw) is flown.

The writing bit selection transistor TRA is composed of a PMOS transistor. It is to be noted that the writing bit selection transistor TRA may be composed of an NMOS transistor for the following reason. In the PMOS transistor, voltage drop, that is, so-called "threshold voltage (Vth) drop" does not exist. Thus, the PMOS transistor has an advantage that the writing voltage VW from the fuse voltage supply circuit 6 is accurately given to the bit line BL.

Meanwhile, by using the P-type channel transistor, the occupied area thereof is increased. Further, since the P-type channel transistor (TRA) and the N-type channel transistor (TRB) are used at the time of programming (writing), the P-type channel transistor should be managed at the time of manufacturing. Further, designing should be made by considering characteristics balance between the P-type channel transistor (TRA) and the N-type channel transistor (TRB). Thus, optimum designing of an applied voltage to change resistance of the fuse device F is significantly more difficult than in the case that a transistor inserted into a current path at the time of programming of FIG. 1 is only the N-type access transistor TRB.

Whether the PMOS transistor is used as illustrated in FIG. 1 or the NMOS transistor is used for the writing bit selection transistor TRA may be decided by comprehensively taking the foregoing advantage and the foregoing disadvantage into account.

The writing bit selection transistor TRA is, for example, included in the bit control circuit of the memory cell array 1. The bit control circuit includes a pattern holding circuit 2 for holding input data and outputting a control bit for a bit and a reading circuit 3 including a sense amplifier and a reading data register in addition to the writing bit selection transistor TRA.

The pattern register 2 is a circuit for performing bit selection control at the time of programming for the writing bit selection transistor TRA based on an inputted bit address signal BADR. Specifically, the pattern register 2 provided correspondingly to a certain column inputs a first bit FB [a] generated based on the inputted bit address signal BADR to the gate of the writing bit selection transistor TRA provided correspondingly to the column. Further, the pattern register 2 provided correspondingly to another column inputs a second bit FB [b] generated based on the inputted bit address signal BADR to the gate of the writing bit selection transistor TRA provided correspondingly to the column.

It is to be noted that FIG. 1 exemplifies a case that the number of columns in the plurality of memory cells MC arranged in a matrix state is two. However, in general, the number of columns is larger than two, for example, 64. In this case, the bit address signal BADR is given to each pattern register 2 as a 6 bit control signal. It is to be noted that the number of columns may be larger than 64, for example, 128, 256, and so on. Meanwhile, the number of columns may be smaller than 64, for example, 4, 8, 16, or 32. The bit count of the bit address signal BADR is determined according to the number of columns.

It is to be noted that the foregoing function of the pattern register 2 is able to be substituted by a so-called column decoder. The column decoder is a circuit for determining a bit line switch (in this case, the writing bit selection transistor TRA) selected from an inputted column address.

The reading circuit 3 is connected to the bit line BL, and has a function to detect and read electric potential of the bit line BL with the use of the sense amplifier. For example, the reading bit selection transistor TRC composed of the PMOS transistor for supply-controlling a power voltage VDD is connected to the bit line BL. The reading bit selection transistor TRC is included in the bit control circuit of the memory cell array 1. A source of the reading bit selection transistor TRC is connected to the VDD line 12, and a drain thereof is connected to the bit line BL.

The reading bit selection transistor TRC has an advantage and a disadvantage similar to those of the writing bit selection transistor TRA. FIG. 1 illustrates PMOS transistor configuration which does not cause "Vth drop." However, in the case where the advantage that all the transistors have NMOS transistor configuration is prioritized, the reading bit selection transistor TRC may have NMOS transistor configuration.

In FIG. 1, according to the fact that the reading bit selection transistor TRC has the PMOS transistor configuration, an inverter INV2 for inverting an inputted reading control signal (READ) and giving the inverted signal to a gate of the reading bit selection transistor TRC is provided. Thus, in the case where the reading bit selection transistor TRC has the NMOS transistor configuration, the inverter INV2 is not necessitated. Further, in the case where the reading control signal (READ) is a low active signal, the inverter INV2 is not necessitated as well.

In FIG. 1, the reading control signal (READ) is given from outside of the device. However, the control signal may be generated inside. In the configuration of FIG. 1, the writing control signal (WRITE) is a low active signal, and the reading control signal (READ) is a high active signal. Thus, it results in "(WRITE), (READ)=L" at the time of writing (programming), and it results in "(WRITE), (READ)=H" at the time of reading.

It is to be noted that the connection relation of the logic circuit 5 and the bit control circuit (the pattern register 2 and the reading circuit 3) is similar to the foregoing connection relation.

Figure 2:
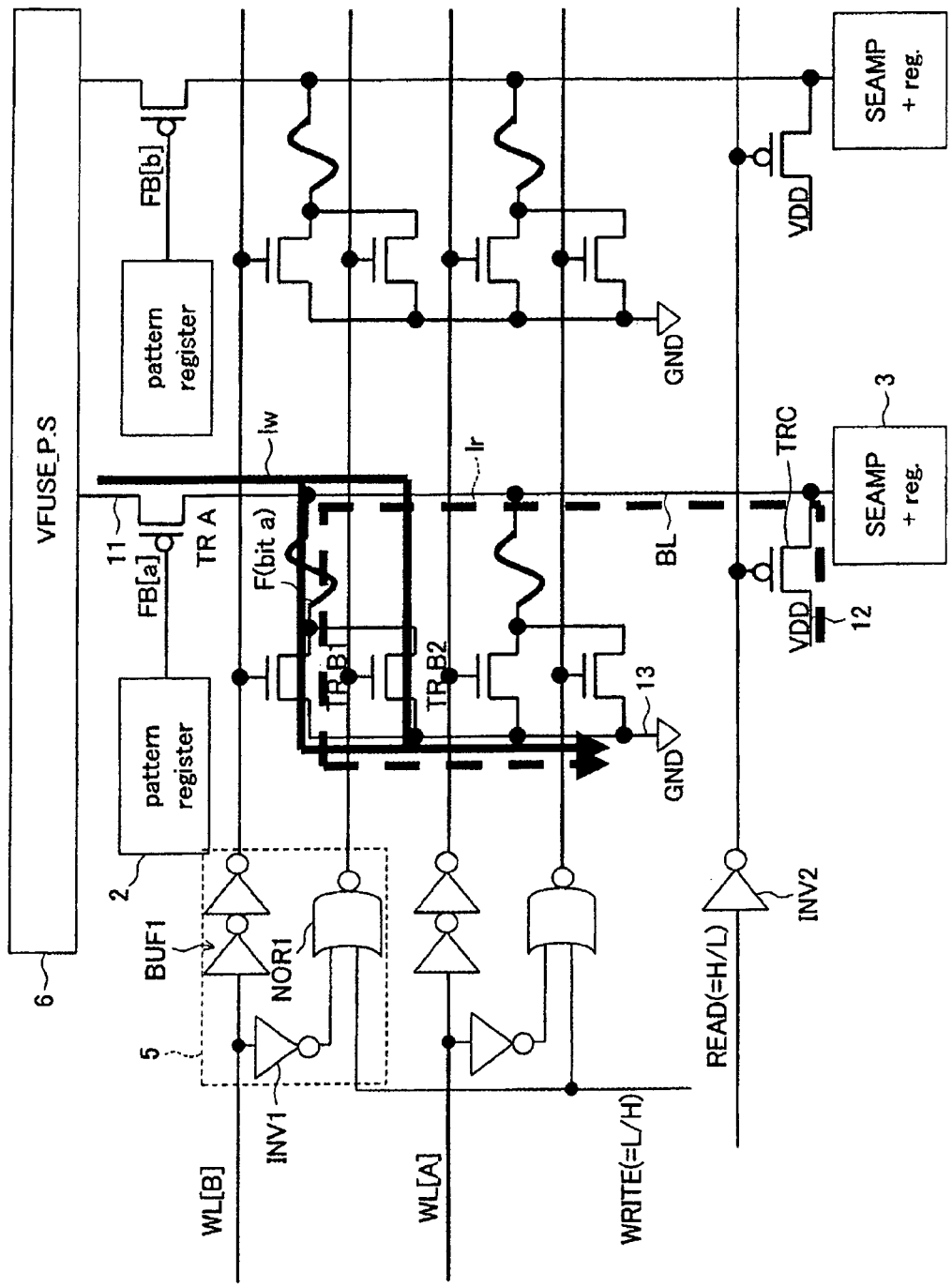
FIG. 2 is a diagram obtained by adding a current path at the time of programming and at the time of reading to the chip configuration diagram of FIG. 1.

FIG. 2 schematically illustrates a current flown at the time of programming operation. In FIG. 2, the current path at the time of programming operation (the first current path) is indicated by a bold full line, and a current path at the time of reading operation (second current path) is indicated by a bold dashed line. A description will be hereinafter given of the programming operation and the reading operation with reference to FIG. 1 and FIG. 2.

[Programming Operation]

An example of programming operation of the first bit [a] will be explained on the premise of the foregoing configuration.

In the initial state of programming, in FIG. 1 and FIG. 2, all the transistors (TRA to TRC) are in a state of OFF. In such a state, the fuse voltage supply circuit 6 outputs the positive writing voltage VW such as a voltage of 3 [V], and the pattern register 2, the word line drive circuit 4, the logic circuit 5, and the like set a signal for controlling the transistors (TRA to TRC) to logic at the time of writing.

More specifically, the pattern register 2 outputs writing bit FB[a]=0 as a bit selection signal. Thereby, the PN-channel-type writing bit selection transistor TRA becomes in a state of ON. Further, the word line drive circuit 4 (FIG. 1) outputs word line drive signal WL [B]=1, and the writing control signal (WRITE)=L and the reading control signal (READ)=L are inputted from outside. Thereby, in the memory cell MC having the fuse device F inscribed as "bita," both the first and the second cell transistors TRB1 and TRB2 are turned ON, and the reading bit selection transistor TRC is turned OFF.

Based on the foregoing bias setting, the comparatively large first current (writing current Iw) with the writing voltage VW given from the fuse voltage supply circuit 6 as a positive power voltage is flown as illustrated in FIG. 2. The writing current Iw is flown to the fuse device F inscribed as "bita" through the first voltage supply line 11, the writing bit selection transistor TRA in a state of ON, and the bit line BL. The current is divided into the first cell transistor TRB1 and the second cell transistor TRB2, and flows into the GND line 13.

In the case where a comparative large current is flown through the current path (the first current path) formed as above, the fuse device F with the highest resistance on the way generates heat. If the fuse device F is composed of, for example, a polysilicon fuse, due to meltdown, and thereby the resistance value of the fuse device F becomes incomparably large. If the fuse device F is composed of, for example, an MOS fuse, due to insulation breakdown, the resistance value of the fuse device F becomes incomparably small.

Meanwhile, in an adjacent bit configuration with writing bit FB[b]=1, the writing bit selection transistor TRA controlled according to the writing bit FB[b] is not turned ON. Thus, a current path is not formed, and the resistance of the fuse device F is not increased.

[Reading Operation]

Reading operation of the first bit [a] will be explained on the premise of the foregoing configuration.

In the initial state of operation of reading the first bit [a] from the memory cell MC, in FIG. 1 and FIG. 2, all the transistors (TRA to TRC) are in a state of OFF. In such a state, output of the fuse voltage supply circuit 6 (writing voltage VW) is desirably controlled at a low level voltage such as a voltage of 0 [V]. Then, the pattern register 2, the word line drive circuit 4, the logic circuit 5, and the like set a signal for controlling the transistors (TRA to TRC) to logic at the time of reading.

More specifically, the pattern register 2 outputs writing bit FB[a]=1 as a bit selection signal. Thereby, the P-channel type writing bit selection transistor TRA is controlled in a state of OFF. Further, the word line drive circuit 4 outputs word line drive signal WL [B]=1, and further, the writing control signal (WRITE)=H and the reading control signal (READ)=H are inputted from outside. Since the writing control signal (WRITE) is H, in the memory cell MC having the fuse device F inscribed as "bita," though the first cell transistor TRB1 is turned ON, the second cell transistor TRB2 is not able to be turned ON. Further, since the reading control signal (READ) is H, the reading bit selection transistor TRC is turned ON.

Based on the foregoing bias setting, a second current (reading current Ir) with a VDD voltage supplied to the VDD line 12 as a positive power voltage is flown. The VDD voltage used at that time becomes a reading voltage VR. However, since the reading voltage VR is smaller than the writing voltage VW, the reading current Ir has a value smaller than that of the writing current Iw. The reading current Ir is flown from the VDD line 12 to the fuse device F inscribed as "bita" through the reading bit selection transistor TRC in a state of ON and the bit line BL. The current is flown into the GND line 13 through the first cell transistor TRB1 in a state of ON.

Electric potential of the bit line BL by the foregoing current has a value obtained by dividing the power voltage VDD by ON resistance of the reading bit selection transistor TRC and combined resistance obtained by adding resistance of the fuse device F and the like to ON resistance of the first cell transistor TRB1.

The sense amplifier in the reading circuit 3 inputs a divided voltage value VD at the drain end of the reading bit selection transistor TRC, and determines whether the relevant divided voltage value VD is high or low with reference to, for example, a certain standard. The result is amplified, for example, as a reading signal of power voltage swing. The amplified reading signal is temporarily retained in an output register in the reading circuit 3, and is outputted outside at the time that all bits read from other bit configuration are all set. It is to be noted that, in the case where the reading signal is read by, for example, an external tester, a user is able to know the information thereof, which is able to be used for evaluation.

Next, a description will be given of an advantage of operation of the circuit according to the first embodiment illustrated in FIG. 1 and FIG. 2 in comparison with a comparative example by explaining a configuration of the comparative example.

[Comparative Example]

Figure 3:
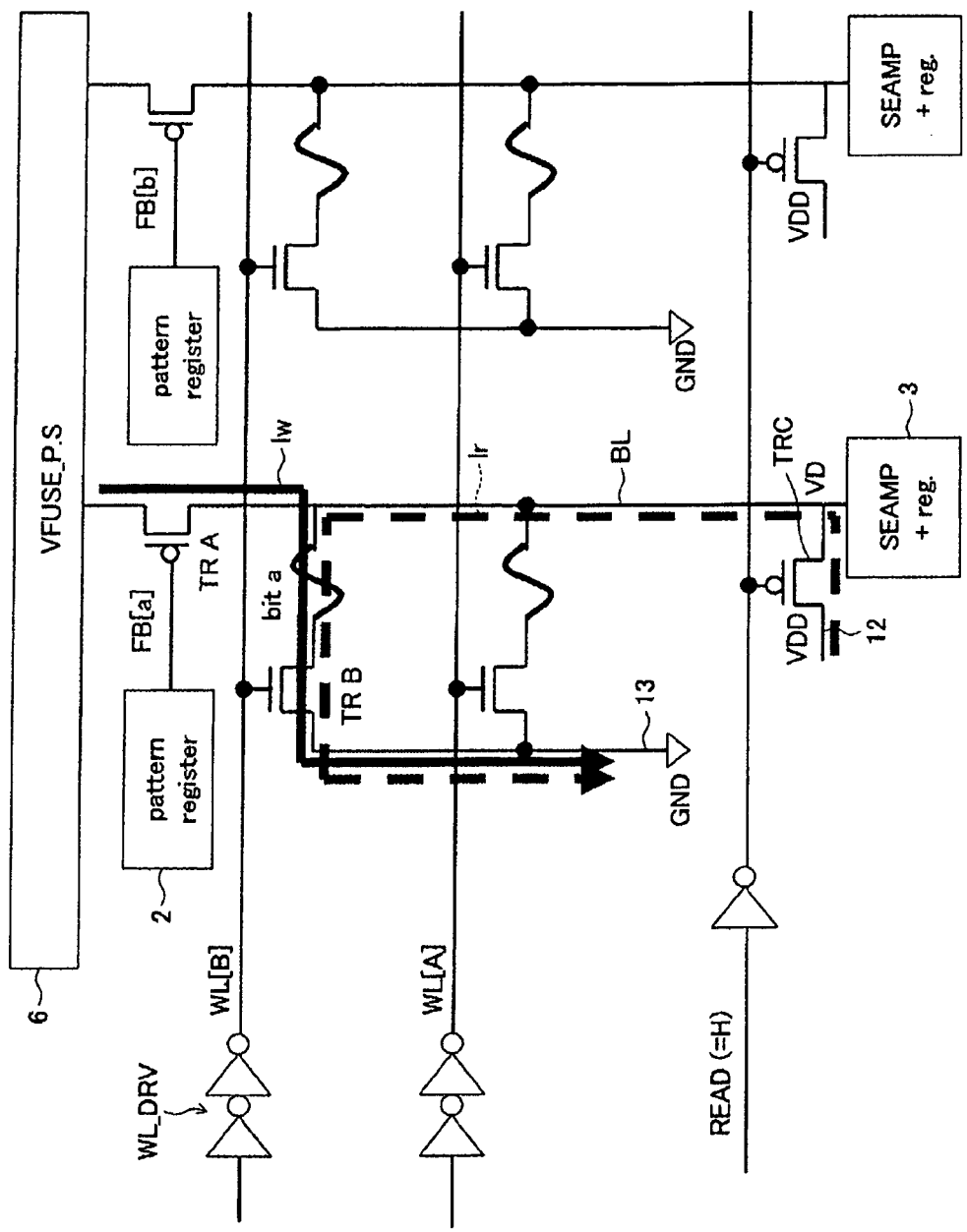
FIG. 3 is a diagram illustrating a device configuration of a comparative example.

FIG. 3 is a diagram illustrating a device configuration of the comparative example.

In the comparative example, connection relation and function of the pattern register 2, the writing bit selection transistor TRA, the reading circuit 3, the reading bit selection transistor TRC, and the fuse voltage supply circuit 6 are similar to the connection relation and the function in the semiconductor device of this embodiment. However, in the comparative example, the NOR circuit NOR1, the inverter INV1, the second access line AL2, the writing control line to which the writing control signal (WRITE) is inputted, and the second cell transistor TRB2 of this embodiment are not provided.

In the memory cell MC in the comparative example, the access transistor TRB connected to the fuse device F is composed of a single NMOS transistor. Thus, the size of the access transistor TRB is set to a comparatively large value, since a comparatively large current should be driven at the time of writing.

[Programming Operation of the Comparative Example]

Next, programming operation of the first bit [a] will be explained on the premise of the foregoing configuration of the comparative example (FIG. 3).

In the initial state of programming, in FIG. 3, all the transistors (TRA to TRC) are in a state of OFF. In such a state, the fuse voltage supply circuit 6 outputs the positive writing voltage VW such as a voltage of 3 [V], and the pattern register 2, the word line drive circuit 4, and the like set a signal for controlling the transistors (TRA to TRC) to logic at the time of writing.

More specifically, the pattern register 2 outputs writing bit FB[a]=0 as a bit selection signal. Thereby, the P-channel type writing bit selection transistor TRA becomes in a state of ON. Further, a word line driver (WL_DRV) outputs word line drive signal WL [B]=1, and further, the reading control signal (READ)=L is inputted from outside. Thereby, in the memory cell MC having the fuse device F inscribed as "bita," the single access transistor TRB having large size is turned ON, and the reading bit selection transistor TRC is turned OFF.

Based on the foregoing bias setting, the comparatively large first current (writing current Iw) with the writing voltage VW given from the fuse voltage supply circuit 6 as a positive power voltage is flown as illustrated in FIG. 3. The writing current Iw is flown to the fuse device F inscribed as "bita" through the first voltage supply line 11, the writing bit selection transistor TRA in a state of ON, and the bit line BL. The current is flown into the GND line 13 through the single access transistor TRB having large size.

In the case where a comparatively large current is flown through the current path (the first current path) formed as above, the fuse device F with the highest resistance on the way generates heat. In this case, if the fuse device F is composed of, for example, a polysilicon fuse, due to meltdown, the resistance value of the fuse device F becomes incomparably large. If the fuse device F is composed of, for example, an MOS fuse, due to insulation breakdown, the resistance value of the fuse device F becomes incomparably small.

Meanwhile, in an adjacent bit configuration with writing bit FB[b]=1, the writing bit selection transistor TRA controlled according to the writing bit FB[b] is not turned ON. Thus, a current path is not formed, and the resistance of the fuse device F is not increased.

[Reading Operation of the Comparative Example]

Next, reading operation of the first bit [a] will be explained on the premise of the foregoing configuration of the comparative example (FIG. 3).

In the initial state of operation of reading the first bit [a] from the memory cell MC, in FIG. 3, all the transistors (TRA to TRC) are in a state of OFF. In such a state, output of the fuse voltage supply circuit 6 (writing voltage VW) is desirably controlled at a low level voltage such as a voltage of 0 [V]. Then, the pattern register 2, the word line drive circuit 4 and the like set a signal for controlling the transistors (TRA to TRC) to logic at the time of reading.

More specifically, the pattern register 2 outputs writing bit FB[a]=1 as a bit selection signal. Thereby, the P-channel type writing bit selection transistor TRA is controlled in a state of OFF. Further, the word line drive circuit 4 outputs word line drive signal WL [B]=1, and the access transistor TRB having large single size is controlled in a state of ON. Further, the reading control signal (READ)=H is inputted from outside. Since the reading control signal (READ) is H, the reading bit selection transistor TRC is turned ON.

Based on the foregoing bias setting, the second current (reading current Ir) with a VDD voltage supplied to the VDD line 12 as a positive power voltage is flown. The VDD voltage used at that time becomes a reading voltage VR. However, since the reading voltage VR is smaller than the writing voltage VW, the reading current Ir has a value smaller than that of the writing current Iw. The reading current Ir is flown from the VDD line 12 to the fuse device F inscribed as "bita" through the reading bit selection transistor TRC in a state of ON and the bit line BL. The current is flown into the GND line 13 through the access transistor TRB in a state of ON.

Electric potential of the bit line BL according to the foregoing current has a value obtained by dividing the power voltage VDD by ON resistance of the reading bit selection transistor TRC and combined resistance obtained by adding resistance of the fuse device F and the like to ON resistance of the access transistor TRB.

The sense amplifier in the reading circuit 3 inputs a divided voltage value VD at the drain end of the reading bit selection transistor TRC, and determines whether the relevant divided voltage value VD is high or low with reference to, for example, a certain standard. The result is amplified, for example, as a reading signal of power voltage swing. The amplified reading signal is temporarily retained in an output register in the reading circuit 3, and is outputted outside at the time that all bits read from other bit configuration are all set. It is to be noted that in the case where the reading signal is read by, for exam*, an external tester, a user is able to know the information thereof, which is able to be used for evaluation.

Next, a description will be given of an advantage of the circuits of this embodiment illustrated in FIG. 1 and FIG. 2 in comparison with the comparative example of FIG. 3.

In this embodiment, the access transistor TRB is divided into the first cell transistor TRB1 and the second cell transistor TRB2. The first cell transistor TRB1 is connected to the first access line AL1, and the second cell transistor TRB2 is connected to the second access line AL2. Meanwhile, in the comparative example, the access transistor TRB is composed of a single access transistor having large size, and the access transistor, TRB is connected to the single word line. As above, each memory cell configuration is different from each other. However, in this embodiment, at the time of programming operation, both the first access line AL1 and the second access line AL2 are concurrently driven, and a current flown through the fuse device F is divided into the first cell transistor TRB1 and the second cell transistor TRB2. Thus, regarding the programming operation, there is no great difference between this embodiment and the comparative example.

It is to be noted that, in FIG. 1 to FIG. 3, in the case where a word line with a large capacity is started and subsequently the writing bit selection transistor TRA is controlled to be turned ON, the large capacity of the word line does not affect programming rate.

Meanwhile, in reading operation, there is a difference between this embodiment and the comparative example. In this embodiment, at the time of reading, only the first access line AL1 is driven. As a result, part of the access transistor TRB, that is, the first cell transistor TRB1 is turned ON, and the second cell transistor TRB2 as the rest of the access transistor TRB is turned OFF. Thus, the capacity of the word line WL at the time of reading (comprehensive capacity of wiring capacity and load capacity) becomes only the capacity of the first access line AL1. Thus, the capacity of the first access line AL1 that mainly determines gate load of the first cell transistor TRB1 is able to be set smaller than the capacity of the word line in the comparative example. Thus, in this case, at the time of reading, switching of the first cell transistor TRB1 is able to be quickened.

For example, in the case where size of the second cell transistor TRB2 that is used (turned ON) at the time of programming and is not used (turned OFF) at the time of reading is increased, and size of the first cell transistor TRB1 that is used (turned ON) at the time of reading and programming is decreased, compared to the comparative example, switching rate at the time of reading is able to be quickened.

For example, division ratio (size ratio) between the first cell transistor TRB1 and the second cell transistor TRB2 is set to 1:3. In this case, the gate capacity of the first cell transistor TRB1 singly used at the time of reading is about one fourth as much as that of the second cell transistor TRB2. Several tens to several hundreds of transistor gate capacities, in some cases, several thousands of transistor gate capacities are connected to each of the access lines (AL1 and AL2). Thus, in the case where the gate capacity is sufficiently larger than the capacity of the wiring itself, the load capacity of each of the access lines (AL1 and AL2) roughly becomes a value having a positive correlationship with the foregoing transistor size ratio.

Access time at the time of reading is related to the resistance value of the fuse device F, ON resistance of the reading bit selection transistor TRC, and the like. However, the load capacity of the access line (or the word line) is a main factor to lengthen the access time. In this embodiment, the load capacity of the access line (or the word line) is able to be decreased significantly more than that in the comparative example. Thus, in this embodiment, there is an advantage to significantly decrease access time by just that much.

Meanwhile, the access transistor TRB of FIG. 3 is composed of a single transistor, and the size thereof is determined based on needs to flow a large current at the time of writing. Thus, the size is significantly larger than that of the reading bit selection transistor TRC and transistors of other peripheral circuits. Thus, the comparative example has a point to be improved that access time at the time of reading is long.

Further, much of power consumption is consumed for charging and discharging the wiring capacity at the time of increasing and decreasing electric potential. Thus, the fact that the load capacity of the access line (or the word line) is able to be decreased significantly more than that in the case of the comparative example largely contributes to achieving low power consumption as well.

Further, in the configuration of the comparative example, in some cases, access time at the time of reading is long, and desired operation time is not satisfied. In this case, the number of memory cells (storage bit count) connectable per one word line is limited. Such limitation of the number of memory cells similarly occurs in the case where memory power consumption is excessively large due to needs of the system on which the memory is installed. In the device configuration of the comparative example, decreasing the access time and the power consumption and improving the storage bit count per one word line are not able to be concurrently attained.

In this embodiment, such trade-off is resolved or modified, and thereby design freedom is more enlarged. Accordingly, both a given small sized memory and a given large sized memory are able to be realized while desired high speed and low power consumption characteristics are satisfied.

2. Second Embodiment

Figure 4:
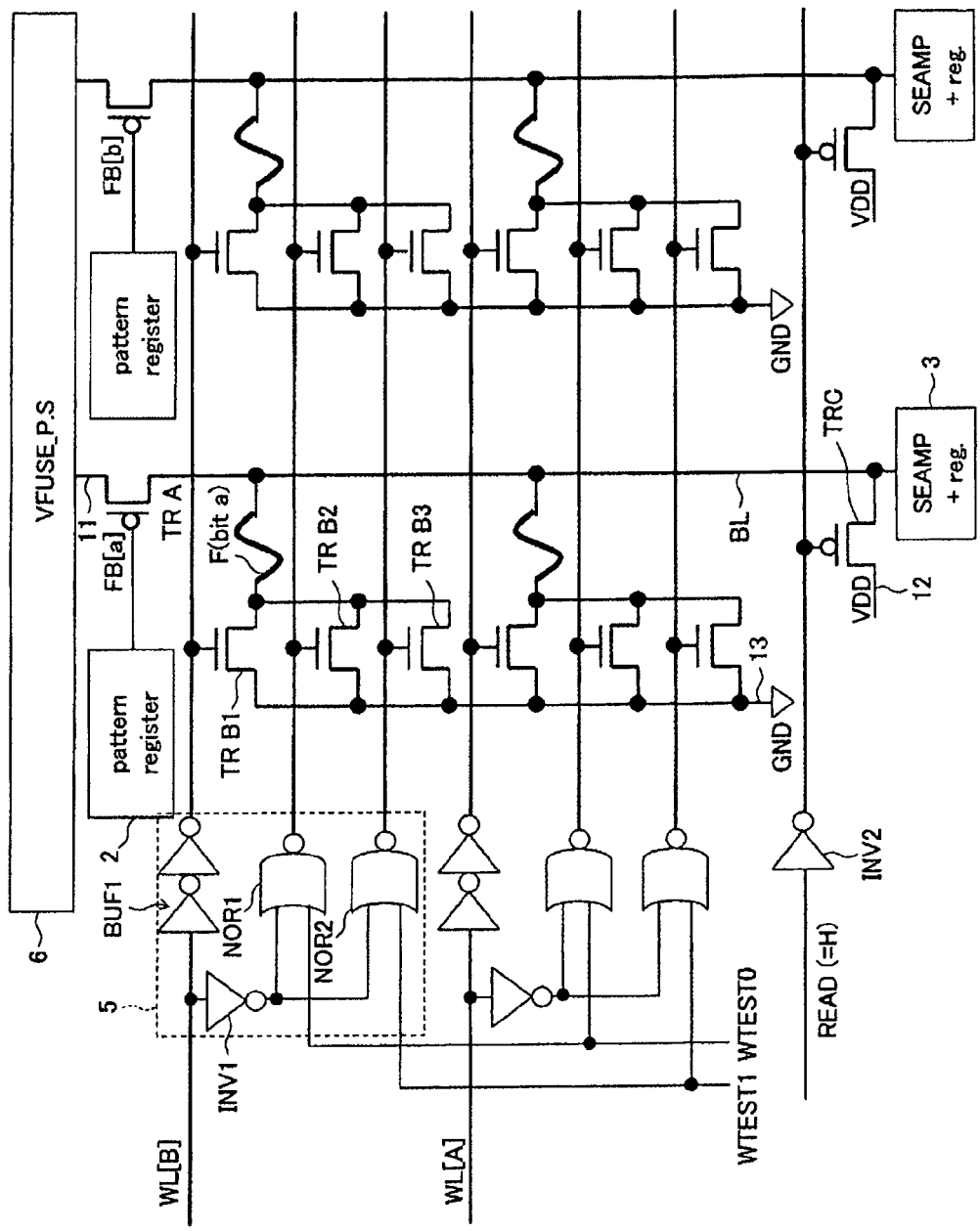
FIG. 4 is a chip configuration diagram of a semiconductor device according to a second embodiment.
Figure 5:
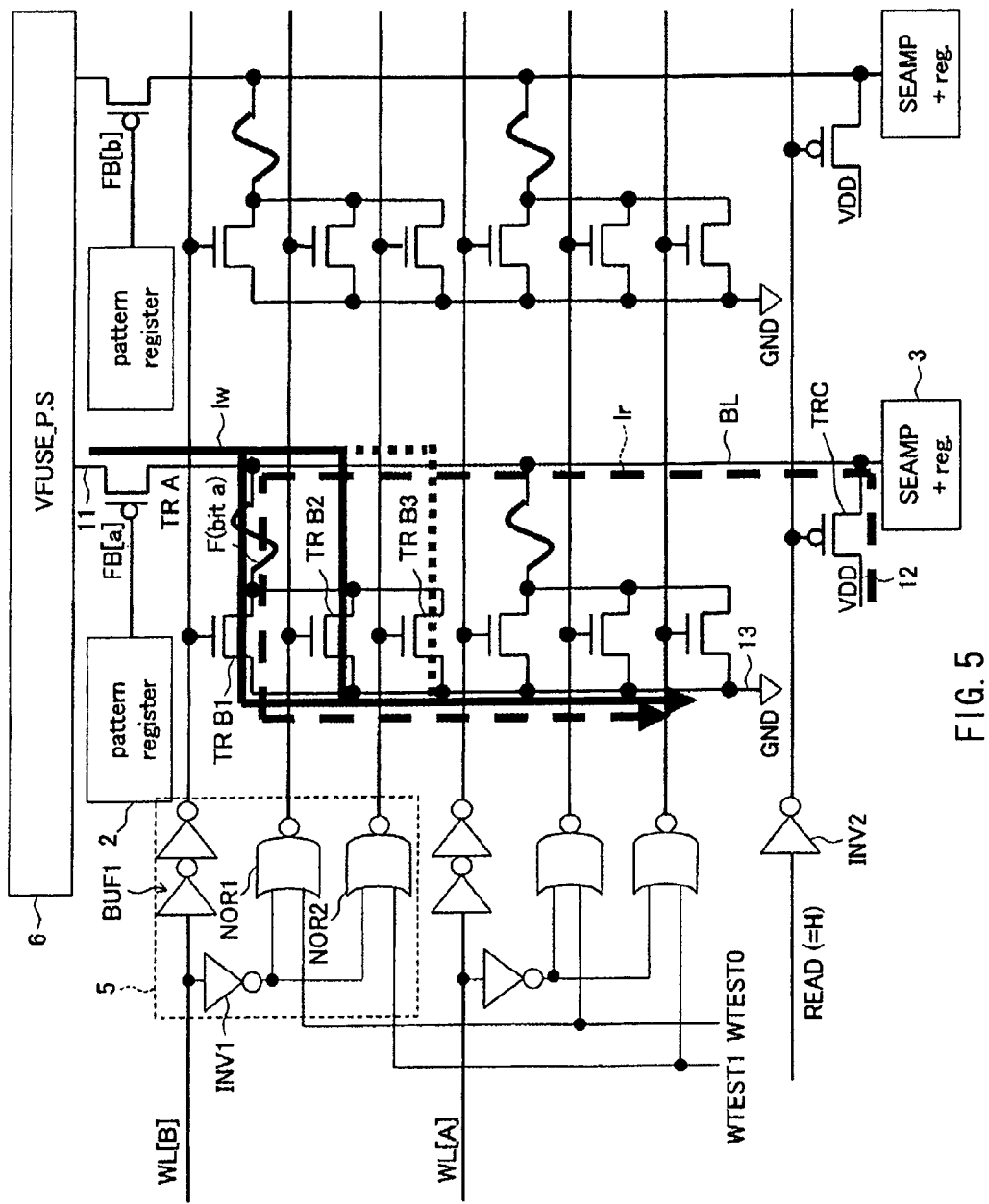
FIG. 5 is a diagram obtained by adding a current path at the time of programming and at the time of reading to the chip configuration diagram of FIG. 4.

FIG. 4 illustrates a chip configuration diagram of a semiconductor device according to the second embodiment. Further, FIG. 5 illustrates a path of a current flown at the time of operation. A description will be given of difference between FIGS. 4 and 5 and FIGS. 1 and 2 according to the first embodiment. In FIGS. 4 and 5, descriptions of the elements affixed with the same referential numbers as those of FIGS. 1 and 2 will be omitted.

In this embodiment, the access transistor TRB is composed of three cell transistors, that is, the first cell transistor TRB1, the second cell transistor TRB2, and a third cell transistor TRB3. The first, the second, and the third cell transistors TRB1, TRB2, and TRB3 are each composed of an NMOS transistor, and are connected to each other in parallel.

In this embodiment, the first cell transistor TRB1 is a cell transistor that is constantly used (is turned ON) at the time of reading and at the time of programming (hereinafter referred to as a "cell transistor X"). Further, the second and the third cell transistors TRB2 and TRB3 each are cell transistors in which whether or not to be used (turned ON or OFF) at the time of reading and at the time of programming is determined based on a switching signal described later (hereinafter referred to as "cell transistors Y"). The first, the second, and the third cell transistors TRB1, TRB2, and TRB3 respectively, for example, have size smaller than that of the access transistor TRB in the case where the access transistor TRB is composed of a single access transistor. Further, the total size of the first, the second, and the third cell transistors TRB1, TRB2, and TRB3 is, for example, equivalent to the size of the access transistor TRB in the case where the access transistor TRB is composed of a single access transistor. For example, the total size of the first and the second cell transistors TRB1 and TRB2 may be, for example, equivalent to the size of the access transistor TRB in the case where the access transistor TRB is composed of a single access transistor. Further, the total size of the first and the third cell transistors TRB1 and TRB3 may be, for example, equivalent to the size of the access transistor TRB in the case where the access transistor TRB is composed of a single access transistor.

Further, in this embodiment, each word line WL is composed of access lines AL1, AL2, and AL3 whose number (3) is equal to the number of the cell transistors included in the access transistor TRB. The access line AL1 is connected to a gate of the first cell transistor TRB1, the access line AL2 is connected to a gate of the second cell transistor TRB2, and the access line AL3 is connected to a gate of the third cell transistor TRB3. The access line AL1 is a line to which the word line drive signals WL[A], WL[B], and so on are inputted. The access lines AL2 and AL3 are lines to which the auxiliary word line drive signals WL[A]aux, WL[B]aux, and so on that are generated in response to the word line drive signals WL[A], WL[B], and so on are inputted.

One logic circuit 5 is provided for every column. In this embodiment, the logic circuit 5 includes, for example, one buffer circuit BUF1, one inverter INV1, and NOR circuits NOR1 and NOR2 whose number (2) is equal to the number of the cell transistors Y included in the access transistor TRB. It is to be noted that, in the case where the plurality of memory cells MC are arranged in one row, the logic circuit 5 is provided for every memory cell.

The NOR circuits NOR1 and NOR2 have 2 inputs and 1 output configuration. The output of the NOR circuit NOR1 is connected to the second access line AL2. One input of the NOR circuit NOR1 is connected to the first access line AL1 through the inverter INV1, and the other input of the NOR circuit NOR1 is connected to a switching signal line. Similarly, the output of the NOR circuit NOR2 is connected to the third access line AL3. One input of the NOR circuit NOR2 is connected to the first access line AL1 through the inverter INV1, and the other input of the NOR circuit NOR2 is connected to the switching signal line. The foregoing switching signal line is a line to which a switching signal is inputted. The switching signal is a signal for controlling output of the auxiliary word line drive signals WL[A]aux, WL[B]aux, and so on generated in response to the word line drive signals WL[A], WL[B], and so on to the access lines AL2 and AL3. That is, the switching signal is a signal for controlling ON/OFF of the second and the third cell transistors TRB2 and TRB3 connected to the access lines AL2 and AL3.

The NOR circuits NOR1 and NOR2 perform NOT operation of a logical sum of the signal inputted from the first access line AL1 through the inverter INV1 (the signals obtained by inverting the signal waveforms of the word line drive signals WL[A], WL[B], and so on) and the signal inputted from the switching signal line (switching signal). Only in the case where no input exists in both the two input terminals, the NOR circuits NOR1 and NOR2 output H (high). In the case where input exists at least in one of the two input terminals, the NOR circuits NOR1 and NOR2 output L (low).

Accordingly, the word line drive circuit 4 and the logic circuit 5 control ON/OFF of the plurality of cell transistors included in each memory cell by inputting the word line drive signals WL[A], WL[B], and so on to the first access line AL1 and inputting the auxiliary word line drive signals WL[A]aux, WL[B]aux, and so on to the second access line AL2 and the third access line AL3. As described later in detail, the word line drive circuit 4 and the logic circuit 5 control ON/OFF of the plurality of cell transistors included in each memory cell so that the number of cell transistors turned ON at the time of reading operation is smaller than the number of cell transistors turned ON at the time of programming operation (at the time of writing operation).

It is to be noted that, in this embodiment, since the number of the cell transistors Y included in the access transistor TRB is two, the number of cell transistors that is turned ON only at the time of reading is "two" at maximum in FIG. 4. However, the number may be "one."

A switching signal WTEST0 in writing test mode is inputted as a switching signal to one of two inputs of the NOR circuit NOR2. Further, a switching signal WTEST1 in writing test mode is inputted as a switching signal to one of two inputs of the NOR circuit NOR1, instead of the writing control signal (WRITE) in the case of FIG. 1. It is to be noted that the foregoing two switching signals WTEST0 and WTEST1 may be a signal inputted from outside of the device, or may be a signal generated in an internal circuit of the device based on an external input signal.

The other configurations of the second embodiment are similar to those of the first embodiment. It is to be noted that, though not illustrated, in FIG. 4, as in FIG. 1, a signal controlling the pattern register 2 may be inputted, and further, the word line drive circuit 4 may be provided in the device according to needs.

In the circuit configuration of FIG. 4, size of the access transistor at the time of programming is four-step changeable, and adjustment of programming conditions is possible. Further, under the adjusted programming conditions, regarding the current path at the time of reading, the number of cell transistors that are additionally turned ON is able to be increased in addition to the first cell transistor TRB1. However, the following description will be given on the premise that size of the first cell transistor TRB1 is fixed to size giving necessary drive power at the time of reading, and size of the access transistor at the time of programming (total gate width) is four-step changeable.

Figures 6, 7:
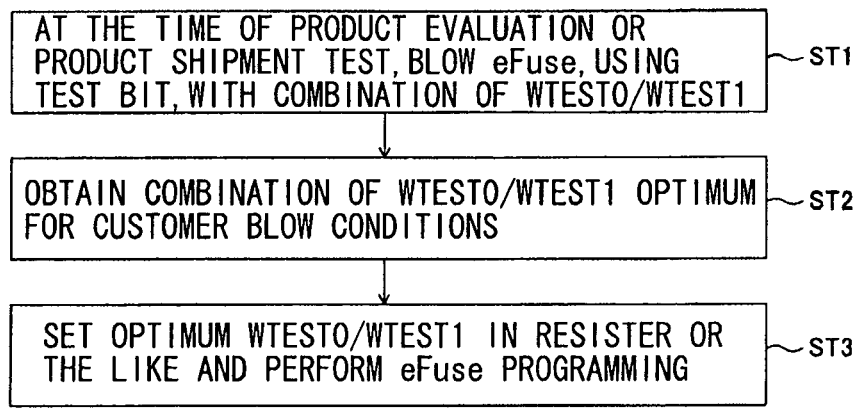
FIG. 6 illustrates relation between logical combination of switching signals and the total gate width (W length) of access transistors in the semiconductor device of FIG. 4.
FIG. 7 is a flowchart illustrating a control example at the time of test in the semiconductor device of FIG. 4.

FIG. 6 illustrates relation between logical combination of the switching signals WTEST0 and WTEST1 and the total gate width (W length) of the first to the third cell transistors TRB1 to TRB3. In this example, the W length of the first cell transistor TRB1 is 5 [μm], the W length of the second cell transistor TRB2 is 20 [μm], and the W length of the third access transistor TRB3 is 10 [μm].

As illustrated in the figure, the logical combination of the switching signals WTEST0 and WTEST1 is controlled by an external tester or the like. At that time, the total W length determining current drive ability of the writing current Iw of the access transistor is able to be controlled in four stages of 5 [μm], 15 [μm], 25 [μm], and 35 [μm].

FIG. 7 illustrates a control example at the time of test. Examples of premises of such control include, for example, optimization in the case that an appropriate blow current (writing current) of the fuse device F varies according to the product doneness and optimization of the W length for satisfying customer blow conditions. A description will be given hereinafter by taking optimization of the W length to satisfy the customer blow conditions as an example.

In step ST1 of FIG. 7, at the time of product evaluation (trial production or the like) or product shipment test, in a memory cell array for test having a test bit, logic of the switching signals WTEST0 and WTEST1 is variously changed as illustrated in FIG. 6. Further, every time the logic changes, the fuse device F is repeatedly blown. It is to be noted that the memory cell array for test may be previously formed in the product, or a device (chip) arbitrarily sampled from the same wafer or a wafer lot may be used for the test.

In step ST2, for the device having the fuse device F blown under various conditions, based on the writing current value and the reading result at that time, logical combination of the switching signals WTEST0 and WTEST1 optimum for the customer blow conditions is obtained.

In step ST3, the obtained optimum logical combination of the switching signals WTEST0 and WTEST1 is set in the register in the semiconductor device (not illustrated in FIG. 4 and FIG. 5). After that, in the product after shipment provided with the foregoing setting, fuse programming under the blow conditions optimum for customer blow conditions of the shipment customer is possible.

Next, as an example, a description will be given of programming operation of combination of the switching signals WTEST0=0 and WTEST1=1 in FIG. 6. It is to be noted that basic of the programming operation and reading operation is similar to that of the first embodiment. That is, for controlling the writing bit selection transistor TRA and the reading bit selection transistor TRC for bias setting, driving the word line drive signal WL[B], and operation of the reading circuit 3, the description thereof will be hereinafter omitted.

In the programming operation, since the switching signal WTEST0 is 0, output of the NOR circuit NOR1 of FIG. 5, that is, the second access line AL2 is driven at a high level. Further, since the switching signal WTEST1 is 1, output of the NOR circuit NOR2 of FIG. 5, that is, the third access line AL3 remains in the initial state at a low level. Thus, the first cell transistor TRB1 and the second cell transistor TRB2 are turned ON, and the third cell transistor TRB3 is turned OFF. In FIG. 5, a bold line and a fine pitch dashed line illustrate a state that the writing current Iw is flown through the two paths of the first cell transistor TRB1 and the second cell transistor TRB2 and is not flown through the path of the third access transistor TRB3.

Meanwhile, at the time of reading, in the logical combination of FIG. 5, by setting both the switching signals WTEST0 and WTEST1 to "1," as illustrated in the rough pitch dashed line of FIG. 5, the reading current Ir is flown through only the first cell transistor TRB1.

In the second embodiment, the access transistor TRB is divided into the first cell transistor TRB1, the second cell transistor TRB2, and the third cell transistor TRB3. The first cell transistor TRB1 is connected to the first access line AL1, the second cell transistor TRB2 is connected to the second access line AL2, and the third cell transistor TRB3 is connected to the third access line AL3. Meanwhile, in the comparative example, the access transistor TRB is composed of a single access transistor having large size, and the access transistor TRB is connected to the single word line. As above, each memory cell configuration is different from each other. However, in the second embodiment, at the time of programming operation, the first access line AL1, the second access line AL2, and the third access line AL3 are all concurrently driven, only the first access line AL1 and the second access line AL2 are concurrently driven, or only the first access line AL1 and the third access line AL3 are concurrently driven. A current flown through the fuse device F is divided into a plurality of cell transistors each connected to a driven access line. Thus, regarding the programming operation, there is no great difference between this embodiment and the comparative example.

Meanwhile, in the reading operation, there is a difference between this embodiment and the comparative example. In this embodiment, at the time of reading, only the first access line AL1 is driven. As a result, part of the access transistor TRB, that is, the first cell transistor TRB1 is turned ON, and the second and the third cell transistors TRB2 and TRB3 as the rest of the access transistor TRB are turned OFF. Thus, the capacity of the word line WL at the time of reading (comprehensive capacity of wiring capacity and load capacity) becomes only the capacity of the first access line AL1. Thus, the capacity of the first access line AL1 that mainly determines gate load of the first cell transistor TRB1 is able to be set smaller than the capacity of the word line in the comparative example. Thus, in this case, high speed in access time and low power consumption at the time of reading are possible. Further, since the bit count connectable per one word line is able to be increased, a large capacity is able to be attained. Further, in this embodiment, at the time of programming, size of a transistor used for programming is able to be changed. Thus, a voltage, time, and the like at the time of programming are able to be adjusted.

3. Other Modifications

The cell configuration and the control method of the access transistor of the foregoing first embodiment and the foregoing second embodiment are widely applicable as long as a storage device with a resistance value variable according to a flowing current is included. For example, the present invention is applicable to a resistance random access memory device. Examples of the resistance random access memory device to which the present invention is applicable include a memory device using conductivity change according to input/output of conductive ions to/from an insulating film and magnetization direction of a magnetic film, phase change of a crystal structure, ore the like.

As exemplified in FIG. 6 according to the second embodiment, the W length is not limited to "TRB1:TRB2:TRB3=1: 2:4," and other ratio combination is able to be adopted. Further, the W length exemplified in the first embodiment is not limited to "TRB1:TRB2=1:3," and for example, may be 1:2, 1:4, 1:5, or the like.

Further, the W length of the first cell transistor TRB1 that is turned ON both at the time of programming and at the time of reading is not necessarily smaller than W length of other cell transistors. In the case where a storage device is the fuse device F, the writing current Iw should be dramatically larger than the reading current Ir. Thus, in the case where the current difference thereof is large, the W length of the first cell transistor TRB1 is desirably smaller than the W length of other cell transistors. However, in particular, in the foregoing other resistance random access memory device, for example, in the case where the current difference thereof is comparatively small, the W length of the first cell transistor TRB1 is able to be equal to or smaller than the W length of other cell transistors.

In the first and the second embodiments, switching of the cell transistors is performed by the writing control signal (WRITE) or the switching signal WTEST0 and WTEST1 as an external control signal and the internal logic circuit 5 (and the word line drive circuit 4). Switching of the cell transistors may be performed only by the external control signal. In this case, each of the drive signals of the first access line AL1 and the second access line AL2 (and the third access line AL3) are inputted from outside as a control signal.

Further, after the switching signals WTEST0 and WTEST1 are optimized after the test in the second embodiment, switching of the cell transistors is able to be controlled by only the internal circuit as retaining by the internal register. In this case, as the "internal circuit", a configuration including the logic circuit 5 and a register (not illustrated) is exemplified.

The present invention has been specifically described with reference to the embodiments and the modifications of the present invention. However, the present invention is not limited to the foregoing embodiments and the like, and various modifications may be made.

For example, in the second embodiment, the description has been given of the case that the number of cell transistors in which whether or not to be used (turned ON or OFF) at the time of reading and at the time of programming is determined based on the switching signal is two. However, the number thereof may be three or more.

Further, in the foregoing embodiments and the like, the description has been given of the case that the number of cell transistors constantly used (turned ON) at the time of reading and at the time of programming is one. However, the number thereof may be two or more.

The invention claimed is:

1. A semiconductor device comprising:
a memory cell array in which a plurality of memory cells are arranged at least in one row, wherein
the memory cell has
an electric fuse device with a resistance value changeable according to a flowing current and
a plurality of cell transistors having a source or a drain which is connected to one end of the electric fuse device, and
the semiconductor device further including:
a plurality of first lines each connected to a gate of each cell transistors in a form that all the cell transistors arranged on a current path at the time of reading out of all cell transistors and all the cell transistors not arranged on the current path at the time of reading out of all cell transistors are able to be turned ON/OFF independently from each other;
a second line connected to the other end of the electric fuse device; and
a third line connected to one of the source and the drain of each cell transistor which is not connected to the electric fuse device.

2. The semiconductor device according to claim 1, wherein the plurality of the first lines are each connected to a gate of each cell transistor in a form that each cell transistor is able to be turned ON/OFF independently of each other in each memory cell.

3. The semiconductor device according to claim 2, comprising:
for every memory cell in the case where the plurality of memory cells are arranged in one row and for every column in the case where the plurality of memory cells are arranged in a plurality of rows x a plurality of columns, a first current path through which a relatively large first current is flown to the electric fuse device and a second current path through which a relatively small second current is flown to the electric fuse device, and further including
a control circuit controlling ON/OFF of the plurality of cell transistors included in each memory cell so that a number of cell transistors turned ON at the time of flowing the second current through the second current path is smaller than a number of cell transistors turned ON at the time of flowing the first current through the first current path in each memory cell.

4. The semiconductor device according to claim 3, wherein each memory cell includes one first cell transistor and one second cell transistor as the plurality of cell transistors, the control circuit turns the first cell transistor ON in the case of flowing the first current to the electric fuse device, and turns the first cell transistor ON in the case of flowing the second current to the electric fuse device as well in each memory cell, and the control circuit turns the second cell transistor ON in the case of flowing the first current to the electric fuse device, and turns the second cell transistor OFF in the case of flowing the second current to the electricl fuse device in each memory cell.

5. The semiconductor device according to claim 4, wherein the plurality of the first lines include one first access line connected to a gate of the first cell transistor included in each memory cell in one row and one second access line connected to a gate of the second cell transistor included in each memory cell in one row, and wherein the control circuit controls ON/OFF of the first cell transistor and the second cell transistor by inputting a first control signal to the first access line and inputting a third control signal generated by the first control signal and a second control signal to the second access line.

6. The semiconductor device according to claim 3, wherein each memory cell includes one first cell transistor and a plurality of second cell transistors as the plurality of cell transistors, the control circuit turns the first cell transistor ON in the case of flowing the first current to the electric fuse device, and turns the first cell transistor ON in the case of flowing the second current to the electric fuse device as well in each memory cell, and the control circuit turns all the second cell transistors ON in the case of flowing the first current to the electric fuse device, and turns only one or a plurality of cell transistors as part of the plurality of second cell transistors ON in the case of flowing the second current to the electric fuse device in each memory cell.

7. The semiconductor device according to claim 6, wherein the plurality of the first lines include one first access line connected to a gate of the first cell transistor included in each memory cell in one row and a plurality of second access lines each connected to a gate of each of the plurality of second cell transistors included in each memory cell in one row one by one for every memory cell, and wherein the control circuit controls ON/OFF of the first cell transistor and the plurality of second cell transistors by inputting a first control signal to the first access line and inputting a third control signal generated by the first control signal and a second control signal to the plurality of second access lines.

* * * * *